(12) United States Patent
Makino et al.

(10) Patent No.: US 8,193,628 B2
(45) Date of Patent: Jun. 5, 2012

(54) PRINTED WIRING BOARD, A METHOD OF MANUFACTURING PRINTED WIRING BOARD, A SENSOR MODULE, AND A SENSING DEVICE

(75) Inventors: Toshihiko Makino, Kanagawa (JP); Atsushi Koyanagi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 316 days.

(21) Appl. No.: 12/557,020

(22) Filed: Sep. 10, 2009

(65) Prior Publication Data
US 2010/0084727 A1 Apr. 8, 2010

(30) Foreign Application Priority Data
Oct. 7, 2008 (JP) ................................. 2008-260814
Dec. 15, 2008 (JP) ................................. 2008-317853

(51) Int. Cl.
*H01L 23/12* (2006.01)
(52) U.S. Cl. ........ 257/688; 257/294; 257/432; 257/669; 257/E31.127
(58) Field of Classification Search .................. 257/225, 257/254, 294, 432, 688, 689, E31.127; 156/60
See application file for complete search history.

(56) References Cited

U.S. PATENT DOCUMENTS

| 5,786,589 | A  | * | 7/1998  | Segawa et al. ............ 250/208.1 |
| 7,345,349 | B2 | * | 3/2008  | Yamamoto et al. ........... 257/433 |
| 2001/0028104 | A1 | * | 10/2001 | Fukatsu et al. ............... 257/685 |
| 2005/0104186 | A1 | * | 5/2005  | Yang et al. .................... 257/688 |
| 2006/0234767 | A1 | * | 10/2006 | Nishikawa et al. ........ 455/556.1 |
| 2009/0315130 | A1 | * | 12/2009 | Ro et al. ....................... 257/432 |

FOREIGN PATENT DOCUMENTS

| JP | 56-2272      | 6/1954  |
| JP | 5-211276     | 8/1993  |
| JP | 5-87983      | 11/1993 |
| JP | 6-232514     | 8/1994  |
| JP | 2002-247425  | 8/2002  |
| JP | 2002-338915  | 11/2002 |
| JP | 2004-335602  | 11/2004 |
| JP | 2005-333142  | 12/2005 |
| JP | 2006-210915  | 8/2006  |
| JP | 2006-287349  | 10/2006 |
| JP | 2008-125080  | 5/2008  |
| JP | 2008-219559  | 9/2008  |
| JP | 2008-233960  | 10/2008 |

\* cited by examiner

*Primary Examiner* — Allan R Wilson
(74) *Attorney, Agent, or Firm* — Oblon, Spivak, McClelland, Maier & Neustadt, L.L.P.

(57) ABSTRACT

A printed wiring board on which a package to be arranged, including: a first layer that is relatively rigid; and a second layer that is relatively flexible and on which the package is to be soldered, wherein an area other than a package arrangement area of the second layer is joined to the first layer by an adhesion layer.

10 Claims, 17 Drawing Sheets

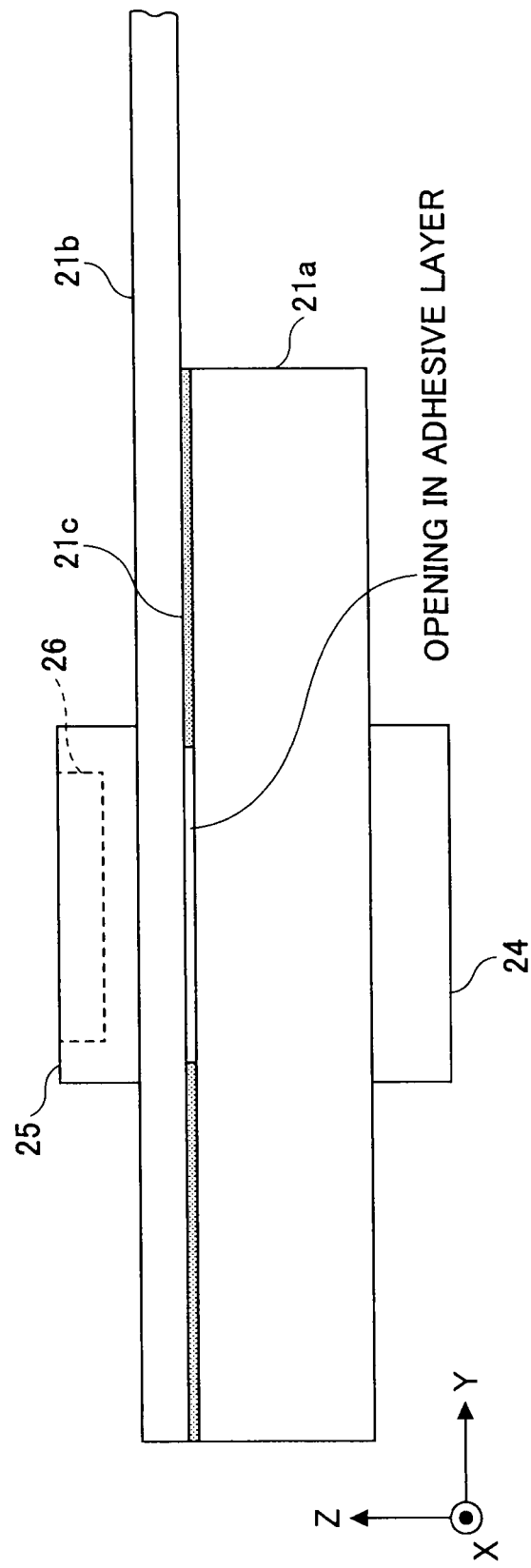

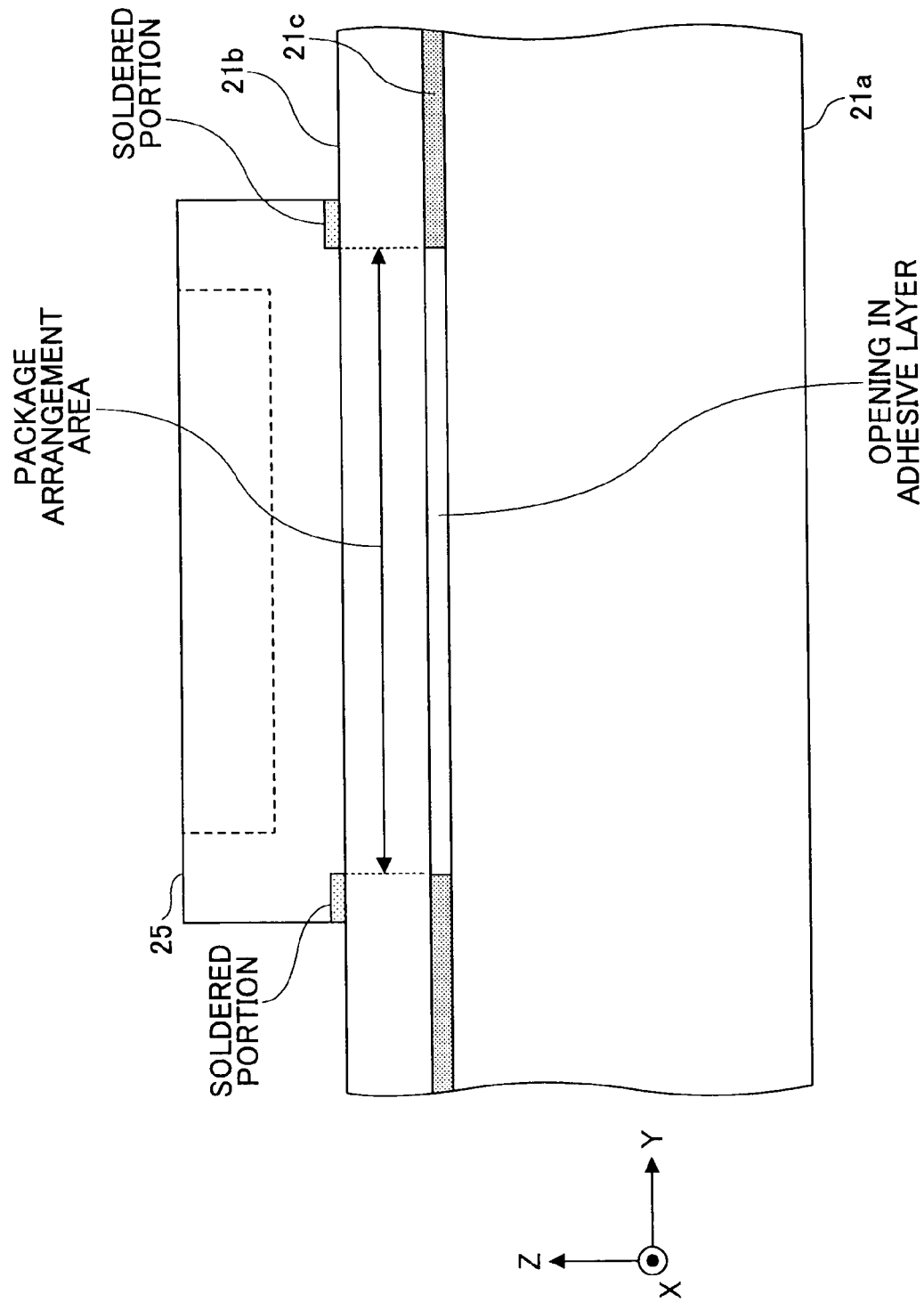

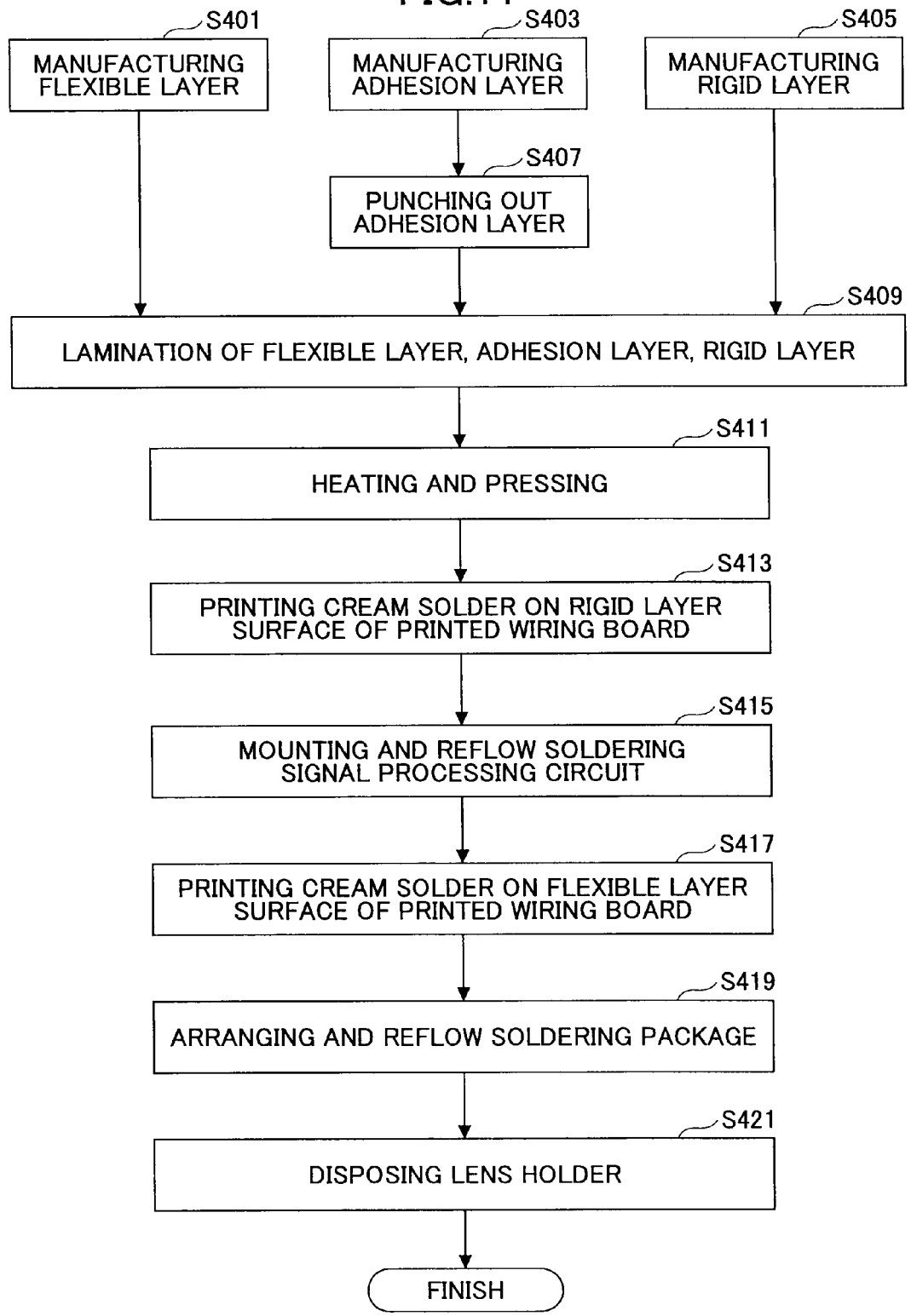

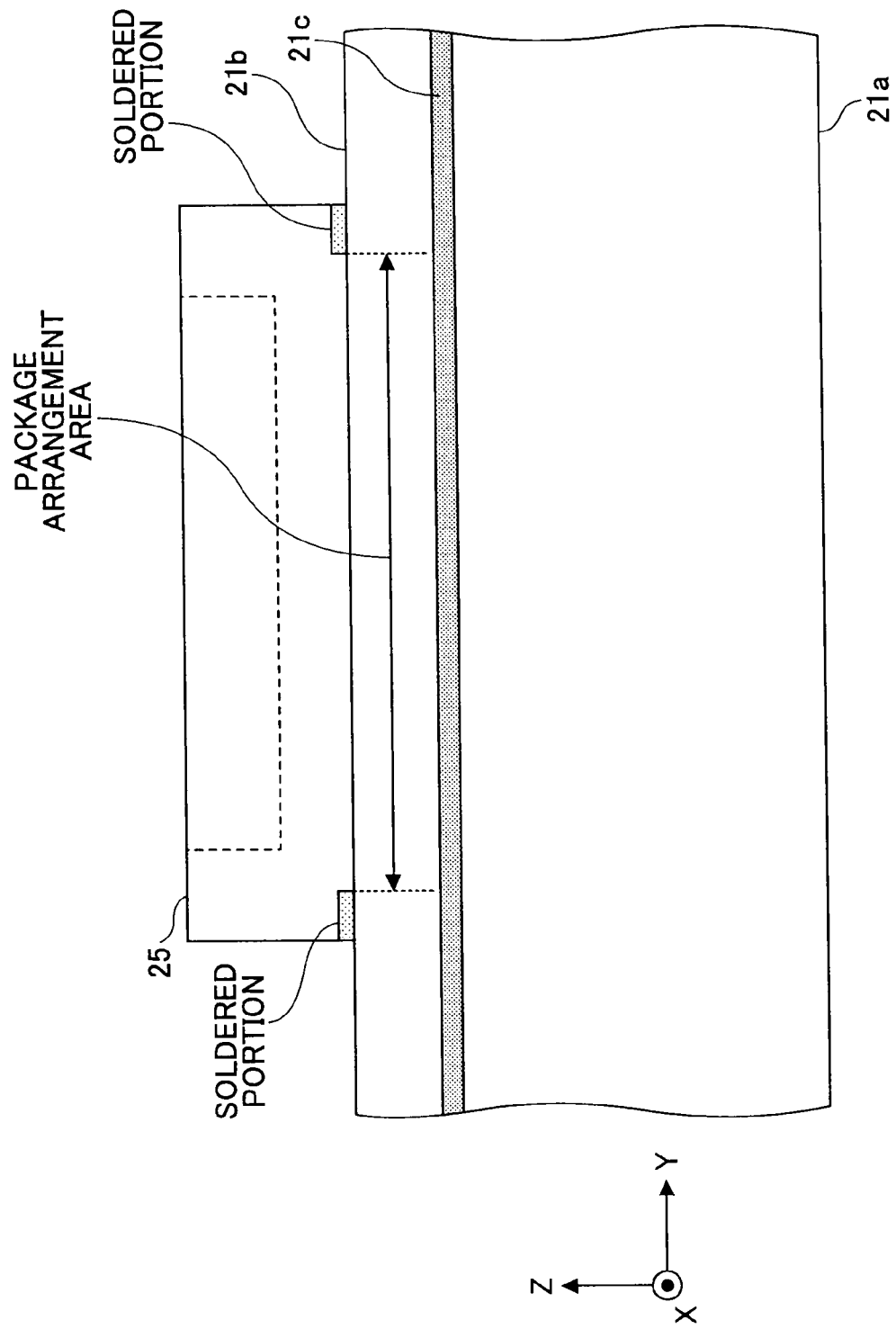

FIG.14A
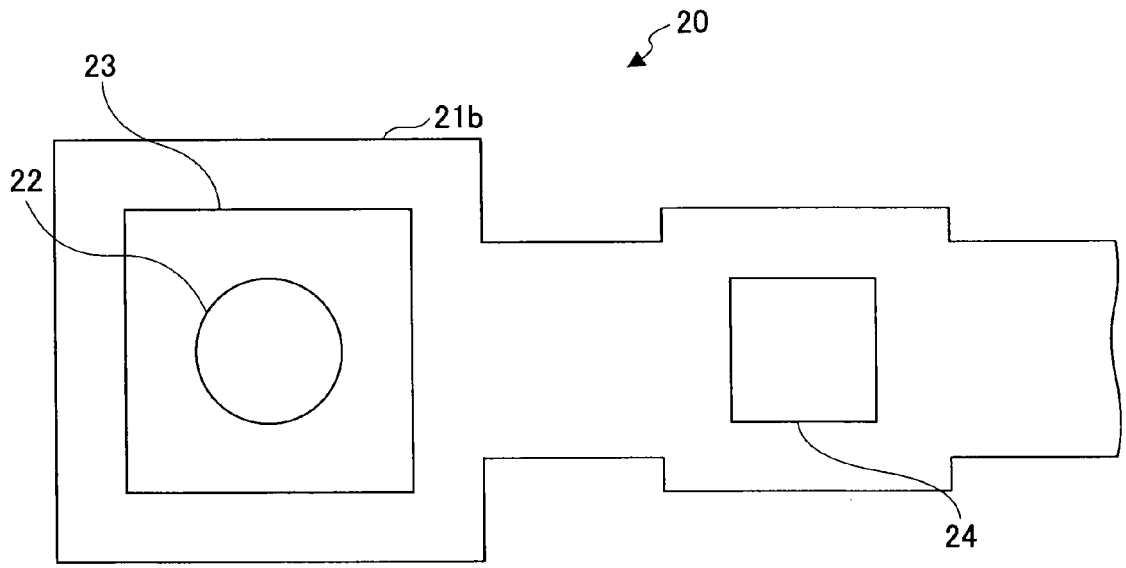
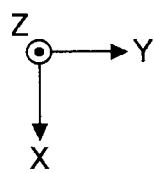
FIG.14B
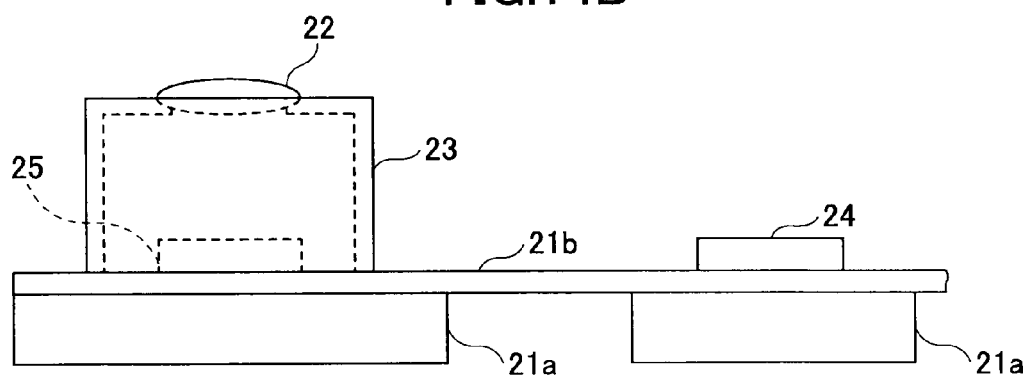
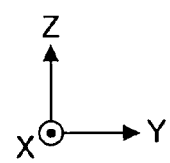

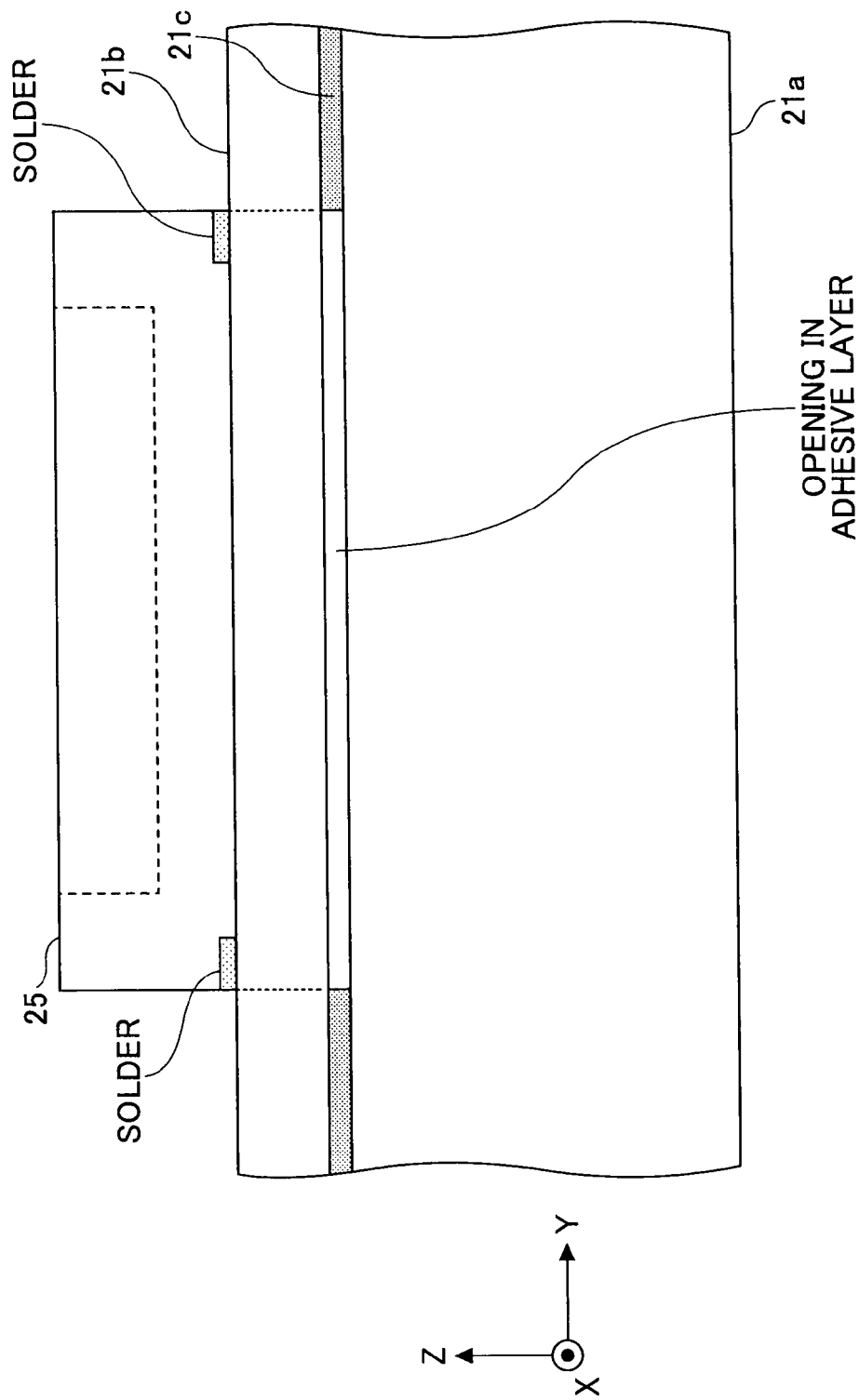

PRINTED WIRING BOARD, A METHOD OF MANUFACTURING PRINTED WIRING BOARD, A SENSOR MODULE, AND A SENSING DEVICE

BACKGROUND OF THE INVENTION

1. Field of the Invention

The present invention generally relates to a printed wiring board, a method of manufacturing printed wiring board, a sensor module, and a sensing device, and more specifically, to a printed wiring board on which a package is arranged, a method of manufacturing the printed wiring board, a sensor module having a sensor equipped in the printed wiring board, a sensing device with the sensor module arranged on it.

2. Description of the Related Art

Conventionally, an image sensor is used as a solid image picture device in digital still cameras, digital video cameras, various measuring devices, and various monitoring devices (vide Patent Documents 1 to 4).

A complementary metal oxide semiconductor (CMOS) image sensor and a charge coupled device (CCD) image sensor can be exemplified as the image sensor.

Recently, the image sensor is equipped in movable bodies such as vehicles (vide Patent Documents 5 to 7).

Further, a printed wiring board mounting the image sensor is disclosed in, for example, Patent Document 8.

Patent Document 1: Japanese Unexamined Patent Application Publication No. 2008-125080
Patent Document 2: Japanese Unexamined Patent Application Publication No. 2006-210915
Patent Document 3: Japanese Unexamined Patent Application Publication No. 2005-333142
Patent Document 4: Japanese Unexamined Patent Application Publication No. 2002-247425
Patent Document 5: Japanese Unexamined Patent Application Publication No. 2008-233960
Patent Document 6: Japanese Unexamined Patent Application Publication No. 2008-219559
Patent Document 7: Japanese Unexamined Patent Application Publication No. 2006-287349
Patent Document 8: Japanese Unexamined Patent Application Publication No. 2004-335602

Generally, image sensors are mounted on a printed wiring board through a package soldered onto it. However, there has been a possibility that a defect occurs in the soldered portion of the package.

SUMMARY OF THE INVENTION

Embodiments of the present invention may provide a novel and useful printed wiring board which can improve reliability of a soldered joint of a package, solving one or more of the problems discussed above.

Further, the embodiments of the present invention may provide a manufacturing method of the printed wiring board enabling manufacture of the printed wiring board with its reliability of the soldered joint of the package improved.

Furthermore, the embodiments of the present invention may provide a sensor module having excellent reliability.

Furthermore, the embodiments of the present invention may provide a sensing device having excellent reliability.

One aspect of the embodiments of the present invention may be to provide a printed wiring board on which a package is to be arranged, including a first layer that is relatively rigid, and a second layer that is relatively flexible and on which the package is to be soldered, wherein the second layer is joined to the first layer by an adhesion layer in an area other than an arrangement area of the package.

According to this aspect, it is possible to easily improve reliability of a soldered joint of a package.

A second aspect of the embodiments of the present invention may be to provide a method of manufacturing a printed wiring board on which a package is to be arranged, including a first layer that is relatively rigid, and a second layer that is relatively flexible and on which the package is to be soldered, wherein the second layer is joined to the first layer by an adhesion layer in an area other than an arrangement area of the package, including steps of punching out a part of the adhesion layer corresponding to the arrangement area of the package in the second layer, laminating the first layer, the adhesion layer thus punched-out and the second layer, and pressing while heating the layers thus laminated.

According to this aspect, it is possible to easily manufacture a printed wiring board having improved reliability of a soldered joint.

A third aspect of the embodiments of the present invention may be to provide a sensor module including a sensor, a package on which the sensor is disposed, and a printed wiring board on which the package is to be arranged, the printed wiring board including a first layer that is relatively rigid, and a second layer that is relatively flexible and on which the package is to be soldered, wherein the second layer is joined to the first layer by an adhesion layer in an area other than an arrangement area of the package.

According to this aspect, it is possible to realize a sensor module having excellent reliability since a printed wiring board according to an aspect of the present invention is used.

A fourth aspect of the embodiments of the present invention may be to provide a sensing device having a sensor module as described above and a display device for displaying information from the sensor module.

According to this aspect, it is possible to realize a sensing device having excellent reliability since a sensing module according to an aspect of the present invention is used.

Additional objects and advantages of the embodiments will be set forth in part in the description which follows, and in part will be obvious from the description, or may be learned by practice of the invention. Objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 7 is a view for illustrating an opening in an adhesion layer.

FIG. 8 is an enlarged view of the opening in the adhesion layer shown in FIG. 7.

FIG. 11 is a flow diagram for explaining a manufacturing method of image sensor module.

FIG. 12 is a view for illustrating a comparative example of a print wiring board.

FIG. 14A is a view for illustrating a modified example 2 of the image sensor module.

FIG. 14B is a view for illustrating the modified example 2 of the image sensor module.

FIG. 15 is a view for explaining the modified example 1 of the opening in the adhesion layer.

DETAILED DESCRIPTION OF THE PREFERED EMBODIMENTS

Figure 1:
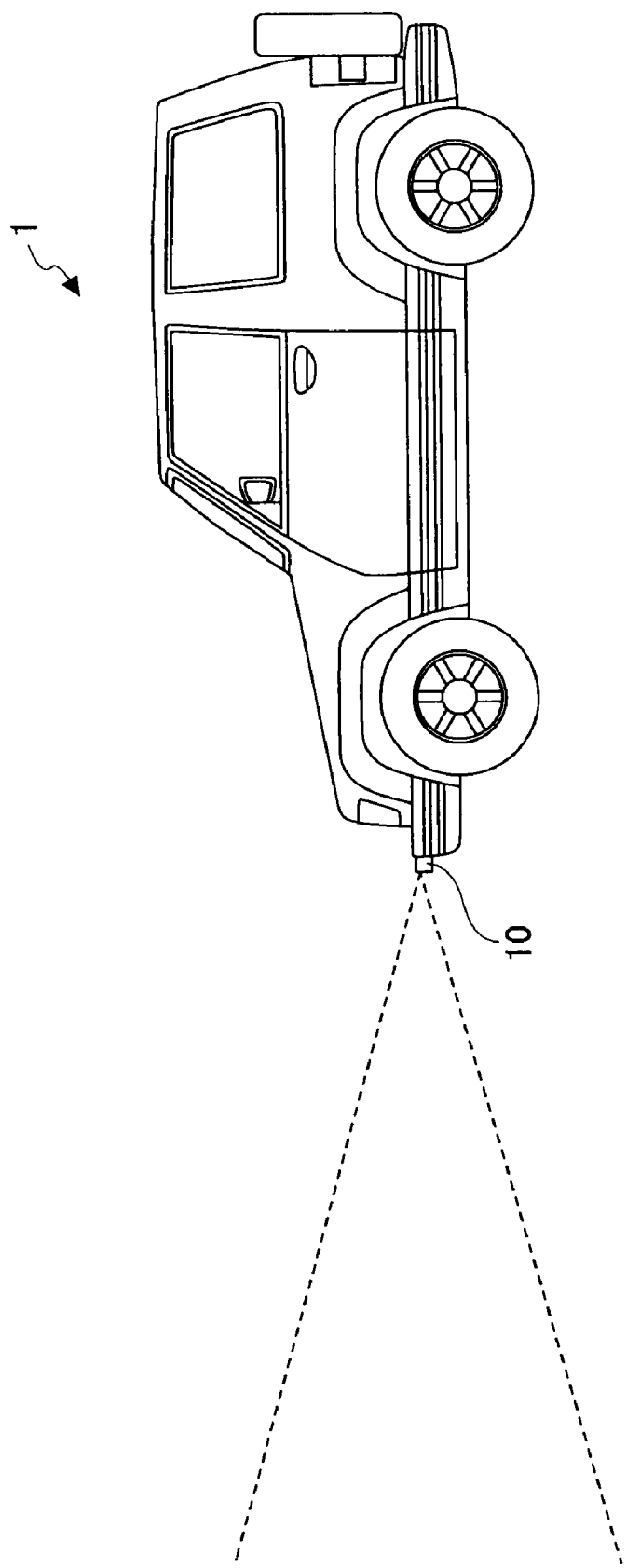
FIG. 1 is an outline view of a vehicle on which a sensing device according to an embodiment the present invention is mounted.

A description is given below, with reference to FIG. 1 through FIG. 12 of embodiments of the present invention. FIG. 1 shows an outline of a vehicle 1 having a sensing device 10 equipped on it according to an embodiment as an example.

According to the embodiment an image sensor module 20 is equipped in the vicinity of a number plate of the vehicle 1 to thereby monitor a travelling direction (forward) of the vehicle 1.

Figure 3:
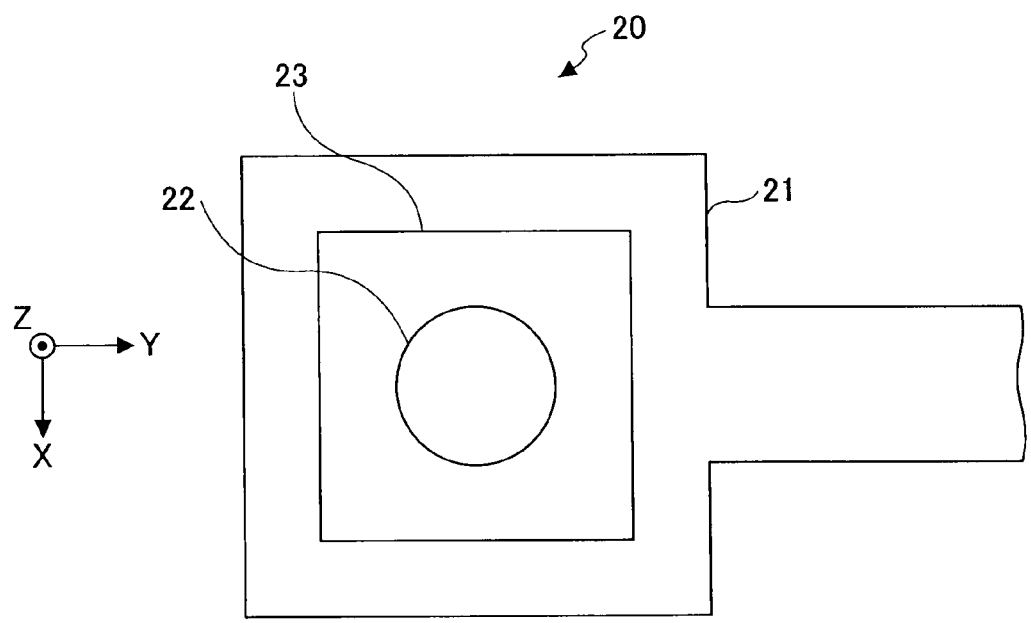
FIG. 3 is a view for illustrating an image sensor module.
Figure 4:
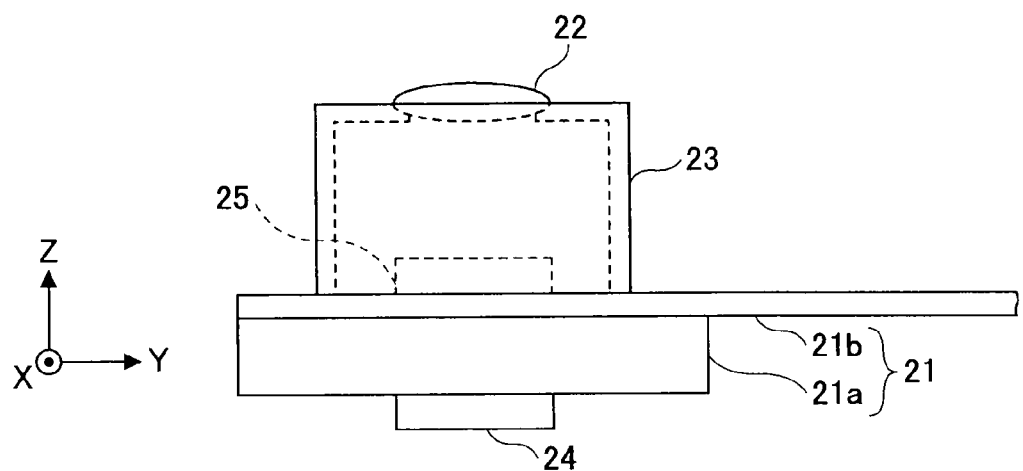
FIG. 4 is another view for illustrating the image sensor module.
Figure 5:
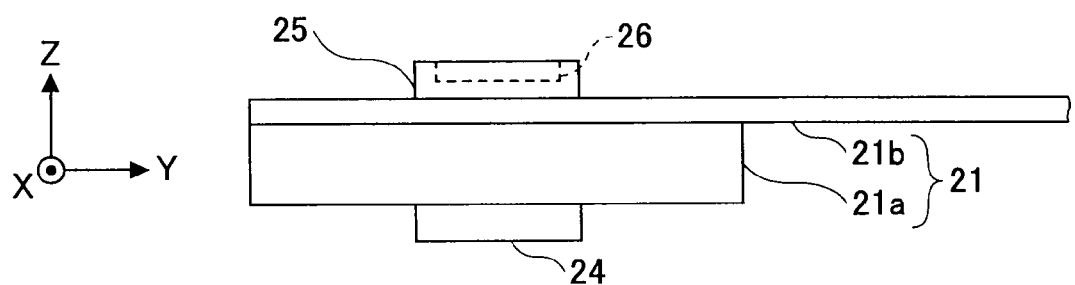
FIG. 5 is another view for illustrating the image sensor module.

As an example shown in FIGS. 3-5, this sensor module 20 includes a printed wiring board 21, a lens 22, a lens holder 23, a signal processing circuit 24, a ceramic package 25, a CMOS image sensor 26 and so on. FIG. 5 shows a state in which the lens holder 23 is removed.

In this specification, explanation is given on the assumption that a direction vertical to the surface of the printed wiring board 21 is the z-axis in the orthogonal coordinate system.

Figure 6A:
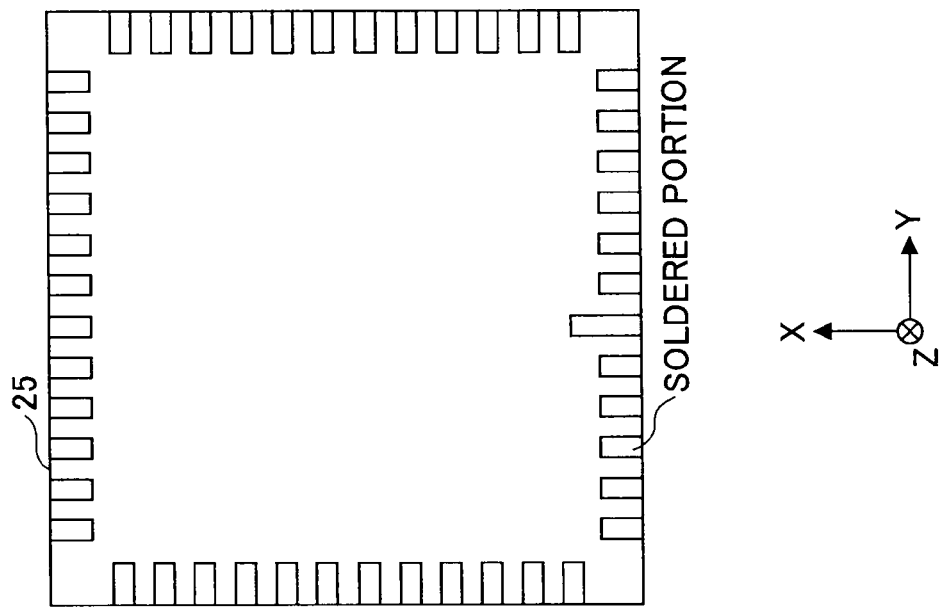
FIG. 6A is a view for illustrating a ceramic package on which a CMOS image sensor is installed.
Figure 6B:
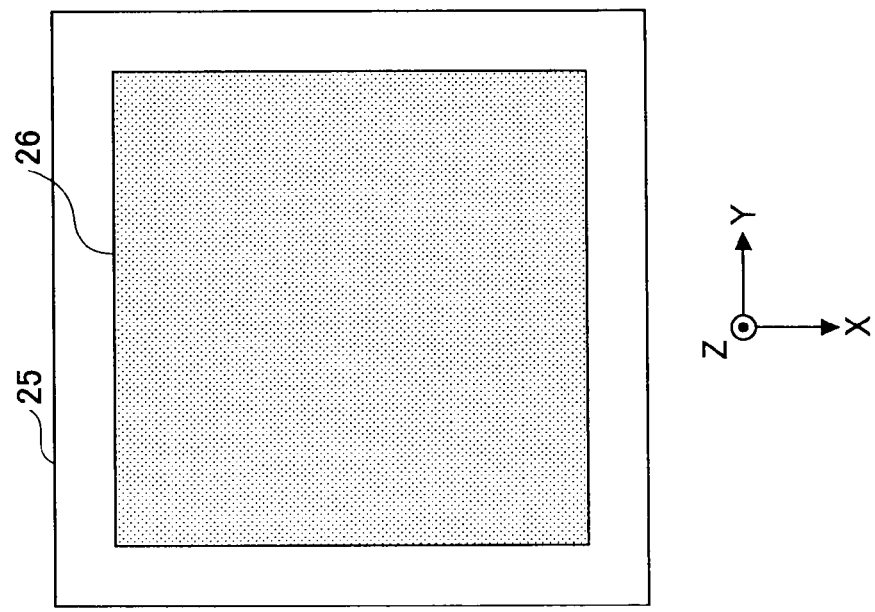
FIG. 6B is a view for illustrating a ceramic package on which a CMOS image sensor is installed.

The CMOS image sensor 26 is mounted on the ceramic package 25 as an example shown in FIG. 6A. As an example shown in FIG. 6B, the ceramic package 25 is a ceramic package of a lead-less type (ceramic quad flat non-leaded package) and has a plurality of soldered portions in the vicinity of its outer periphery.

The printed wiring board 21 includes a rigid layer 21a having rigidity and a flexible layer 21b having flexibility and laminated on the rigid layer 21a. In this, the rigid layer 21a is relatively more rigid than the flexible layer 21b, and similarly the flexible layer 21b is relatively more flexible than the rigid layer 21a.

Further, a coefficient of thermal expansion of the flexible layer 21b and that of the rigid layer 21a are different.

The rigid layer 21a has a wiring pattern (not shown) forming a part of a predetermined electric circuit on a base made from an insulating resin (vide Japanese Unexamined Patent Application Publication No. 2004-335602). The rigid layer 21a may be a single layer structure or a multilayer structure.

The flexible layer 21b has a structure formed by sandwiching a wiring pattern (not shown) forming another part of the predetermined electric circuit by insulating layers made from flame retardant material, for example such as a polyimide (Japanese Unexamined Patent Application Publication No. 2004-335602). The flexible layer 21b has lands (not shown) at a plurality of portions for electrically connecting to the wiring pattern of the rigid layer 21a and terminals of the ceramic package 25.

The flexible layer 21b has an area on which the package is arranged (hereinafter simply referred to as package arrangement area). As shown in FIG. 7, an area other than the package arrangement area of the flexible layer 21b is joined to the rigid layer 21a by the adhesion layer 21c. An opening (nonjoining portion) in an adhesion layer 21c exists between the flexible layer 21b and the rigid layer 21a.

In the example of FIG. 8, which is an enlarged view of a part of FIG. 7, the package arrangement area is an area surrounded by a plurality of soldered portions when the ceramic package 25 is soldered to the flexible layer 21b.

As such, the ceramic package 25 is soldered to be fixed relative to the package arrangement area of the flexible layer 21b.

In FIG. 4, the lens holder 23 holds the lens 22 and is disposed on the printed wiring board 21 to make a predetermined positional relationship of the lens 22 and the CMOS image sensor 26.

The lens holder 23 has a through hole enabling a beam from the lens 22 to penetrate through it. The lens 22 is fixed to an end portion of the lens holder 23 on the +Z side thereof. Meanwhile, the end portion of the lens holder on the −Z side is fixed to the printed wiring board 21 so that the lens 22 is positioned on the +Z side of the ceramic package 25.

The signal processing circuit 24 receives a signal from the CMOS image sensor 26 to carry out a predetermined signal process. The signal process circuit 24 may be integrated, for example, in a single chip.

Figure 9:
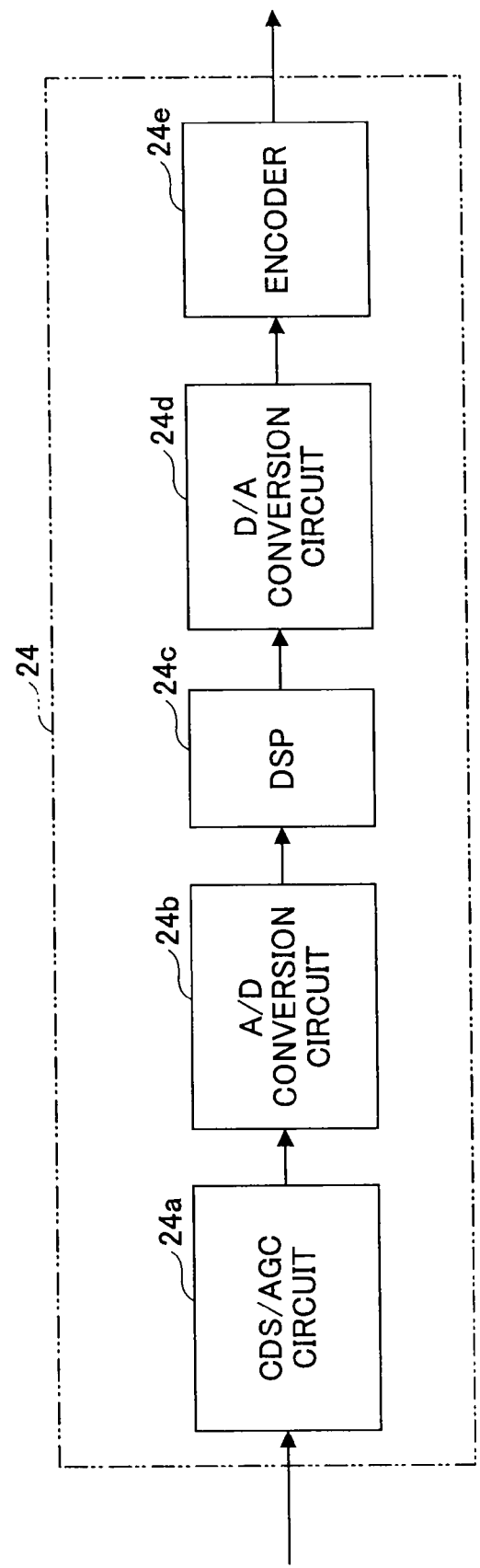
FIG. 9 is a block diagram illustrating a structure of a signal processing circuit.
Figure 10:
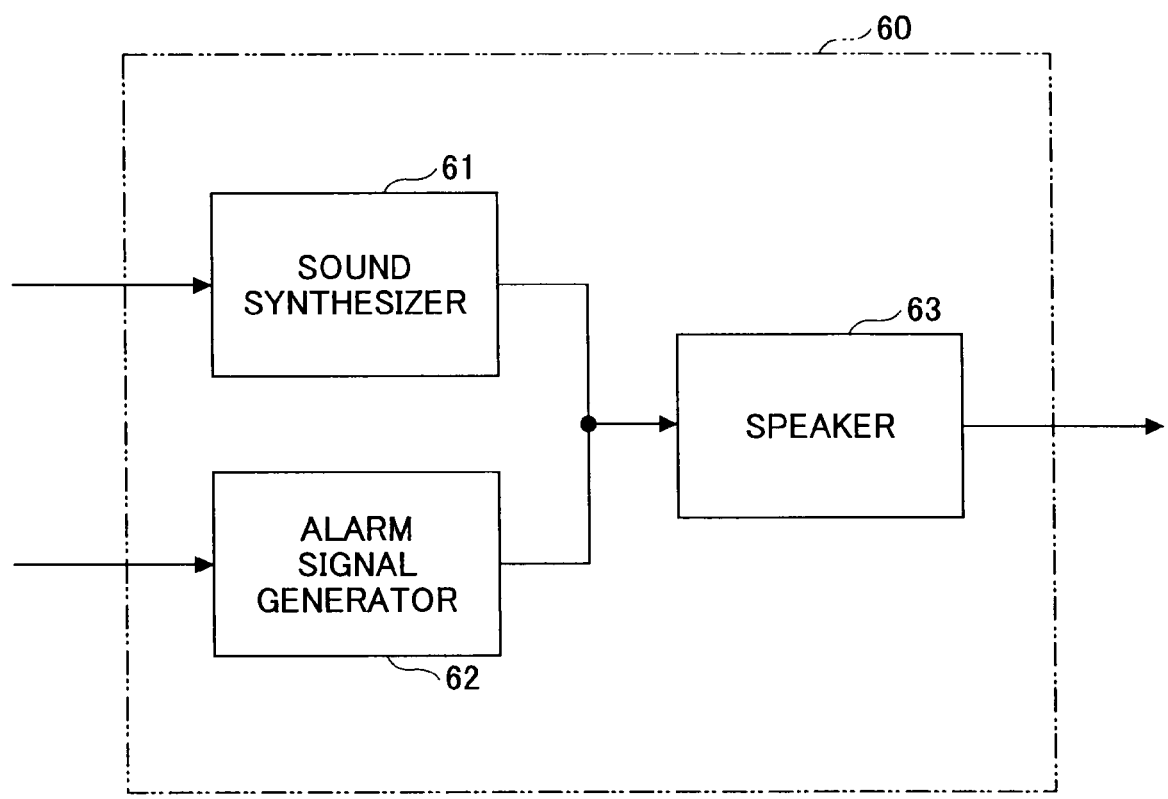
FIG. 10 is a block diagram illustrating structures of a sound and alarm signal generation device.
Figure 13A:
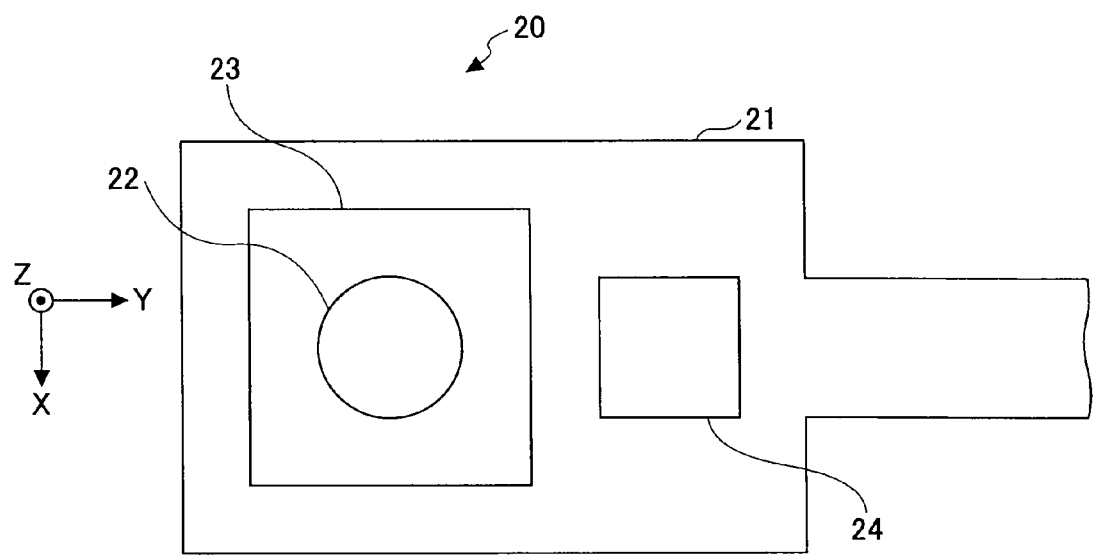
FIG. 13A is a view for illustrating a modified example 1 of an image sensor module.
Figure 13B:
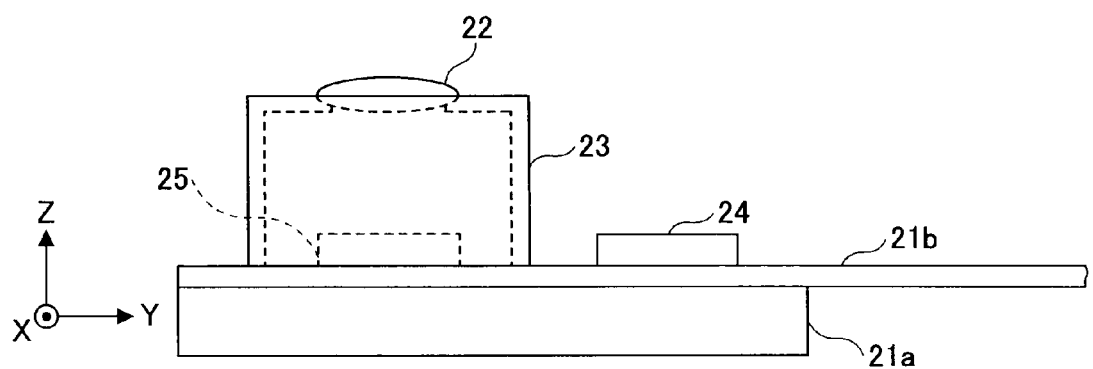
FIG. 13B is a view for illustrating the modified example 1 of the image sensor module.

The signal processing circuit 24 includes, as an example shown in FIG. 9, a CDS/AGC circuit 24a, an A/D conversion circuit 24b, a digital signal processor (DSP) 24c, a D/A conversion circuit 24d, an encoder 24e, and so on.

The CDS/AGC circuit 24a includes a correlated double sampling (CDS) circuit for removing a reset noise included in a signal from the CMOS image sensor 26 and an automated gain control (AGC) circuit for amplifying the signal and controlling it to have a predetermined level.

The A/D conversion circuit 24b converts an analogue signal outputted from the CDS/AGC circuit 24a to a digital signal.

The DSP 24c carries out a correction process with respect to the digital signal outputted from the A/D conversion circuit 24b.

The D/A conversion circuit 24d converts the digital signal outputted from the DSP 24c to an analogue signal.

The encoder 24e converts the analogue signal outputted from the D/A conversion circuit 24d to an analogue video signal. This analogue video signal is an output signal of the signal processing circuit 24.

As shown in FIGS. 4 and 5, the signal processing circuit 24 is disposed on the −Z side of the ceramic package 25 and soldered to the rigid layer 21a. The output signal of the signal processing circuit 24 is supplied to a main control device 40 and a display device 30.

Figure 2:
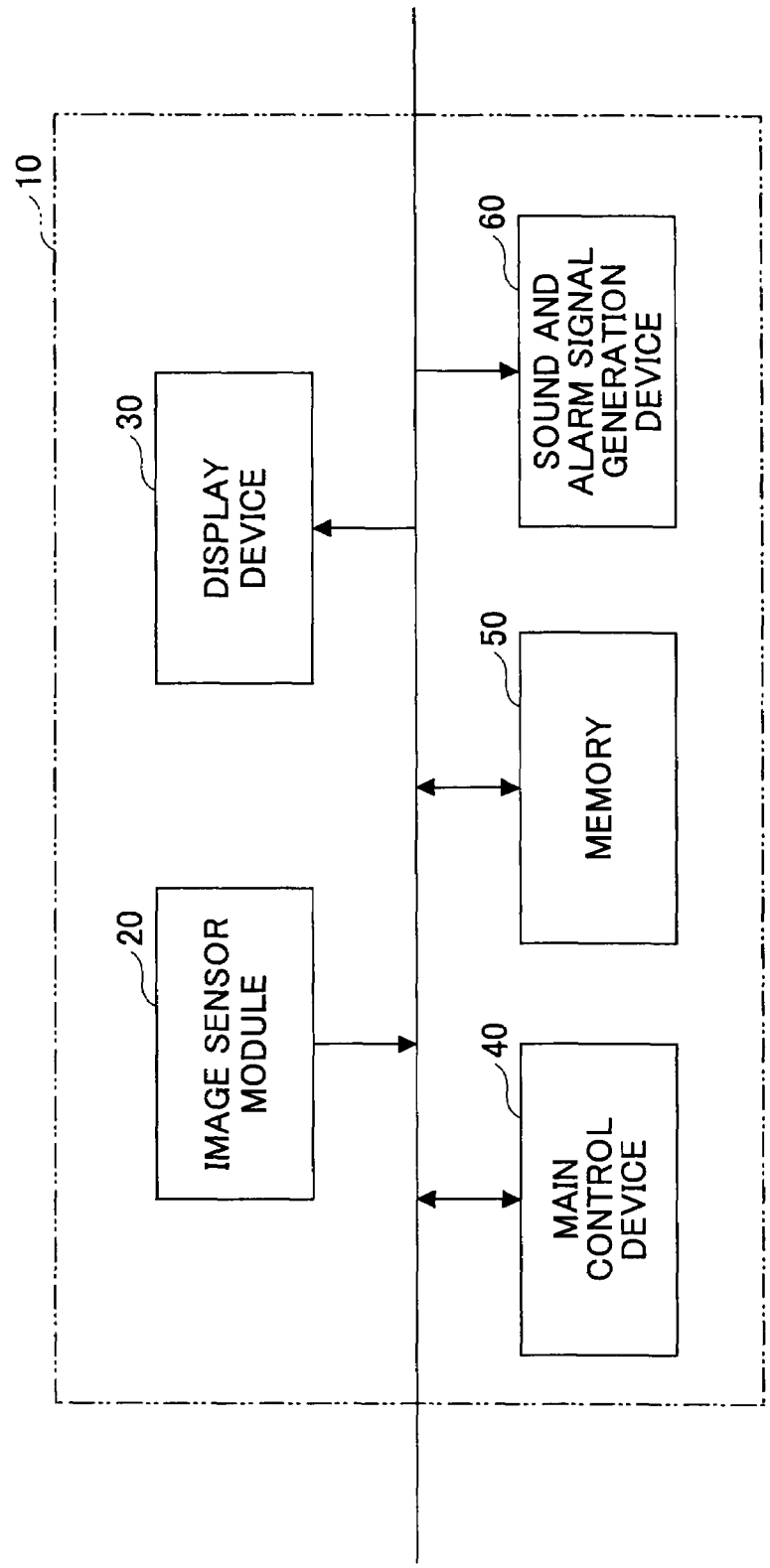
FIG. 2 is a block diagram illustrating a structure of the sensing device.

Referring to FIG. 2, the display device 30 is mounted in the vicinity of a driver's seat to enable a driver to easily see it. The display device 30 images the output signal (analogue video signal) of the signal processing circuit 24.

The main control device 40 controls the sensing device 10. The main control device 40 determines whether or not there is a danger based on the output signal from the signal processing circuit 24. For example, when there is a pedestrian or an obstacle such as another vehicle or a bicycle ahead and collision is predicted, existence of danger is determined and alarm information is outputted to a sound and alarm signal generation device 60.

The display device 30 displays a message corresponding to the alarm information when the display device 30 receives the alarm information from the main control device 40.

The sound and alarm generation device 60 has a sound synthesizer 61, an alarm signal generator 62 and a speaker 63.

The sound synthesizer 61 holds a plurality of sound data and outputs the sound data corresponding to the alarm information that is received from the main control device 40 and outputs the sound data thus selected to the speaker 63.

The alarm signal generator 62 generates an alarm signal corresponding to the alarm information that is received from the main control device 40 and outputs the alarm signal thus selected to the speaker 63.

The main control device 40 stores the output signal from the signal processing circuit 24 in a memory 50 when existence of danger is determined.

Next, a method of manufacturing an image sensor module such as the image sensor module 20 is briefly explained with reference to FIG. 11.

(1) A rigid layer 21a, an adhesion layer 21c, and a flexible layer 21b are manufactured in a manner similar to a conventional technique (Steps S401 to S405) as in, for example, Japanese Unexamined Patent Application Publication No. 2004-335602, which is hereby incorporated by reference.

(2) A portion of the adhesion layer 21c is punched out at an area corresponding to the package arrangement area of the flexible layer 21b (Step S407). By this, an opening is formed in the adhesion layer.

(3) The rigid layer 21a, the adhesion layer 21c thus punched out, and the flexible layer 21b are laminated together in this order (Step S409).

(4) The laminated layers are heated and pressed (Step S411). By this, the printed wiring board 21 is finished.

(5) Cream solder is printed on a surface of the rigid layer 21a (on a −Z side thereof) of the printed wiring board 21 (Step S413).

(6) The signal processing circuit 24 is mounted on the rigid layer 21a and subject to reflow soldering (Step S415). Here, the signal processing circuit 24 is surface-mounted.

(7) Cream solder is printed on a surface of the flexible layer 21b (the +Z side thereof) of the printed wiring board 21 (Step S417).

(8) The ceramic package 25 having the CMOS image sensor 26 disposed on it is arranged on the flexible layer 21b and subject to reflow soldering (Step S419). In this step, the ceramic package 25 is surface-mounted.

(9) The lens holder holding the lens 22 is disposed over the ceramic package 25 (Step S421).

As described above, the first layer is made of the rigid layer 21a, and the second layer is made of the flexible layer 21b.

Further, a method of manufacturing the printed wiring board is carried out in the above "method of manufacturing an image sensor module".

Further, in the sensing device 10 according to the present embodiment, a monitoring control device is configured by the main control device 40 and the sound and alarm signal generation device 60. Further, a sensor module is configured by the image sensor module 20.

As described above, the printed-wiring board 21 according to the present embodiment includes the rigid layer 21a that is relatively rigid, and the flexible layer 21b that is relatively flexible and laminated on the rigid layer 21a. The flexible layer 21a is joined to the rigid layer 21a by the adhesion layer 21c. Here, definitions of "relatively rigid" and "relatively flexible" are as described above.

As described above, since the coefficient of thermal expansion of the flexible layer 21b and that of the rigid layer 21a are different, in a case where there is no opening in an adhesion layer as shown in FIG. 12, which is related to a comparative example, free expansion of the flexible layer is 21b is prevented thereby applying stress on the soldered portion. By this, the soldered portion may become cracked and the crack may expand depending on temperature change and vibration.

Meanwhile, according to this embodiment, since the opening in the adhesion layer 21c is provided as described above, the flexible layer 21b can freely expand to some extent, and the stress applied to the soldered portion can be relieved or diminished in comparison to the conventional technique.

Thus the reliability of the soldered joint of the ceramic package 25 can be improved.

Further, in the present embodiment, since the opening in the adhesion layer 21c is formed by punching out a part, corresponding to the package arrangement area of the flexible layer 21b, on the adhesion layer, the printed wiring board 21 can be easily manufactured.

The image sensor module 20 according to the present embodiment can resultantly improve reliability because the printed wiring board 21 is used.

Further, the sensing device 10 according to the present embodiment can resultantly improve the reliability since the image sensor module 20 is equipped with the printed wiring board 21.

In the above embodiment, there has been explained a case where the ceramic package is 25 is of a lead-less type. However, the present invention is not limited thereto. For example, a package of a ball grid array (BGA) type may be used.

Further, in the above embodiment, a plastic package may be used instead of the ceramic package 25.

Further, although the case of using the CMOS image sensor has been explained in the above embodiment, the present invention is not limited thereto, and a CCD image sensor may be used. In this case, the signal processing unit suitable for the CCD image sensor is used instead of the signal processing circuit 24.

Further, in the above embodiment, there has been explained about the case where the signal processing circuit 24 is surface-mounted on the rigid layer 21a. However, the signal processing circuit 24 may be arranged on the flexible layer 21b.

Further, in the above embodiment, the ceramic package 25 and the signal processing circuit 24 may be mounted over different rigid layers 21a as an example shown in FIGS. 14A and 14B.

Further, in the above embodiment, in a case where it is expected that the stress to the soldered portion is larger than a permitted value because of a large difference in the coefficients of thermal expansion between the flexible layer 21b and the rigid layer 21a, the opening in the adhesion layer may be made larger as an example shown in FIG. 15.

Figure 16:
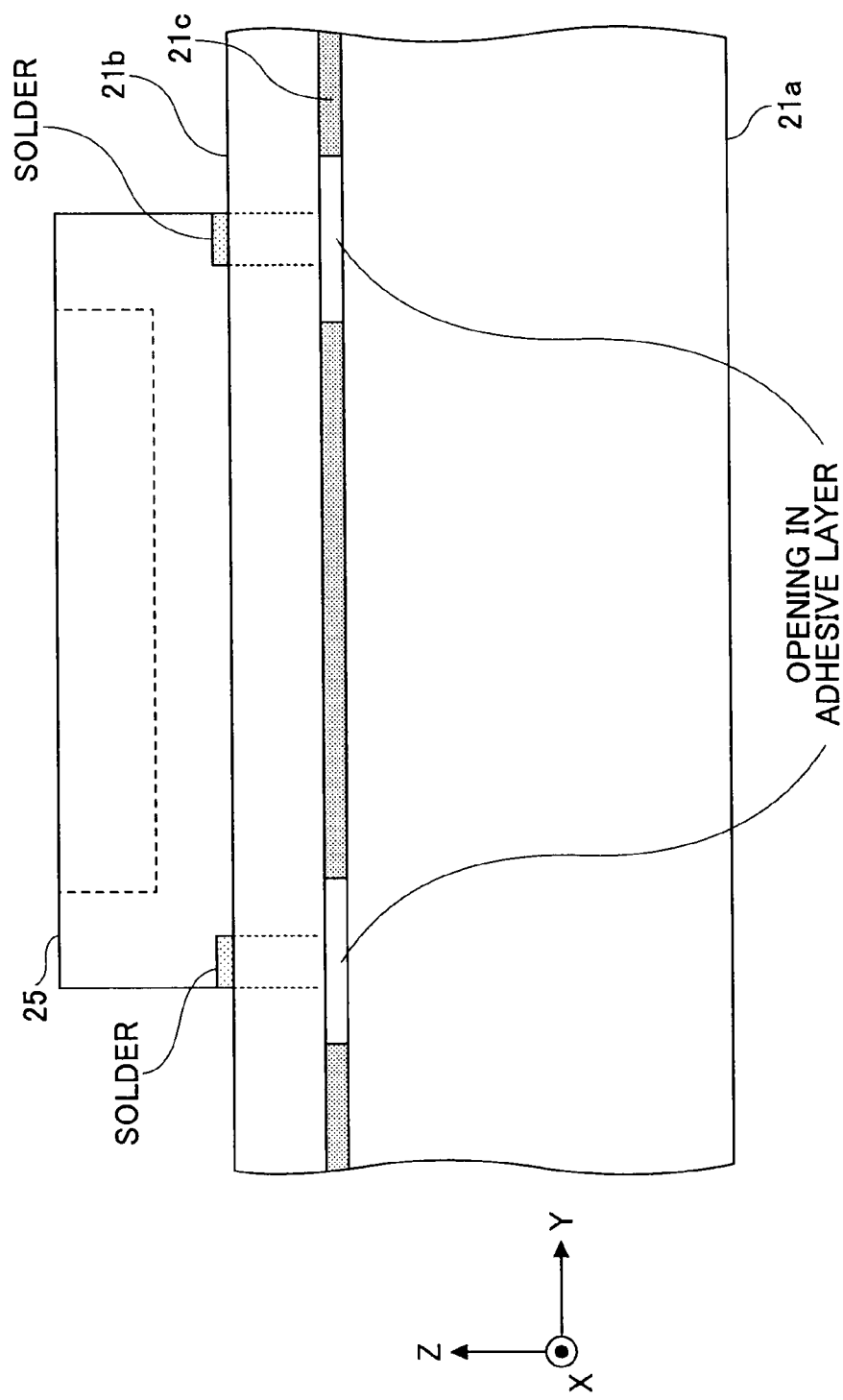
FIG. 16 is a view for explaining the modified example 2 of the opening in the adhesion layer.

Further, the opening in the adhesion layer may be provided only in the vicinity of the −Z side of the soldered portion as an example shown in FIG. 16. In this case it is also possible to allow a free expansion of the flexible layer 21b to some extent thereby decreasing a stress applied to the soldered portion.

Figure 17:
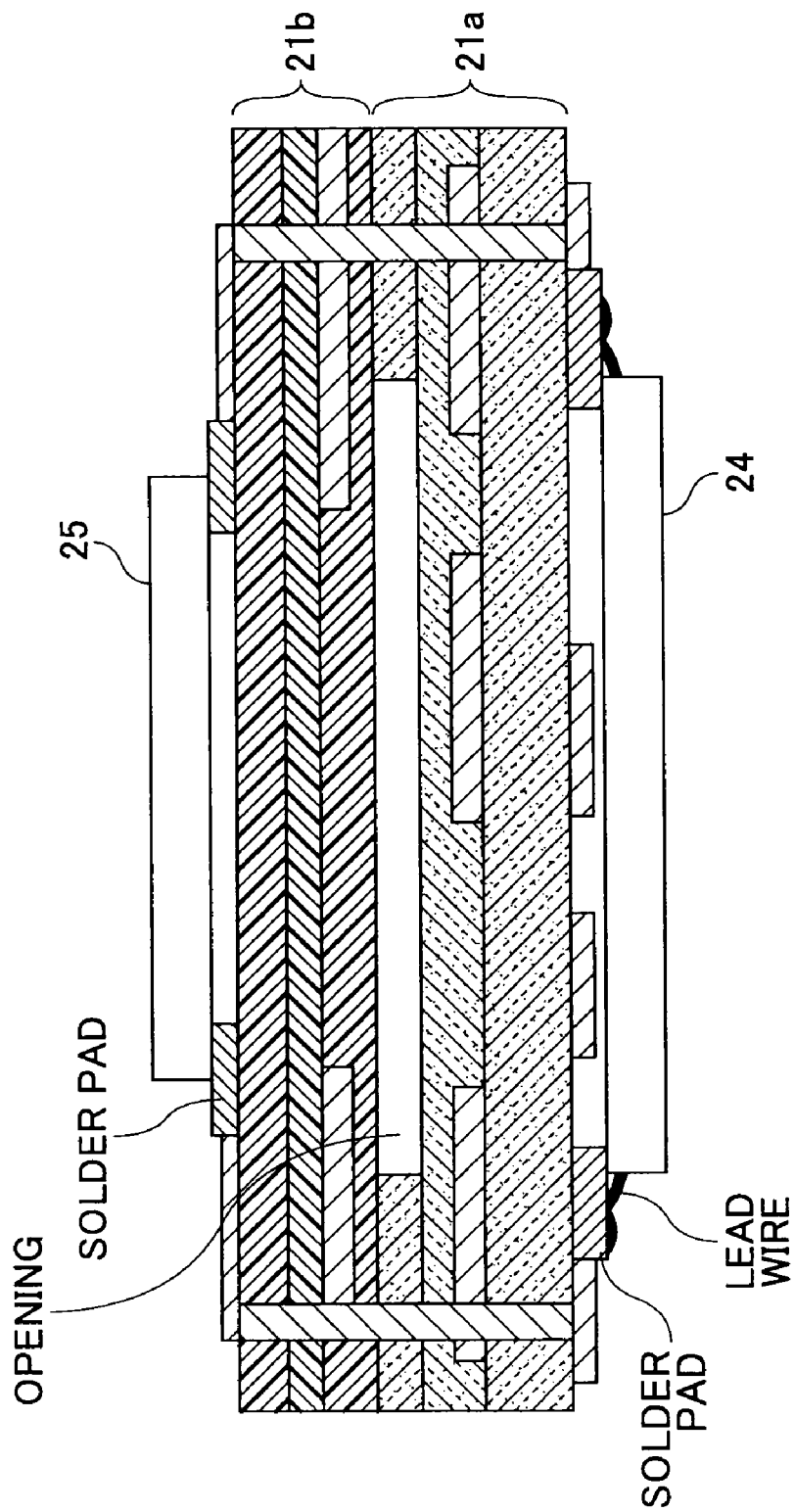
FIG. 17 is a view for showing a modified example of a rigid layer used for a printed wiring board.

As an example shown in FIG. 17, when a rigid layer 21a is configured by a plurality of layers, it is sufficient to form an opening in at least a part of an area positioned under the package arrangement area in at least one of the plurality of the layers. Here, an adhesive layer, a bond or the like is provided between the flexible layer 21b and the rigid layer 21a.

Figure 18A:
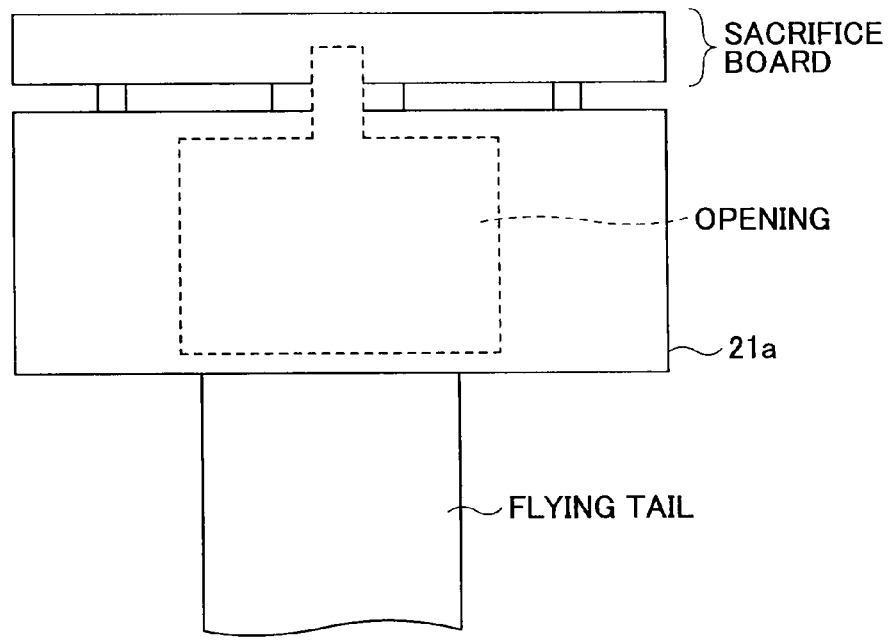
FIG. 18A shows an example of a manufacturing method of the rigid layer shown in FIG. 17.
Figure 18B:
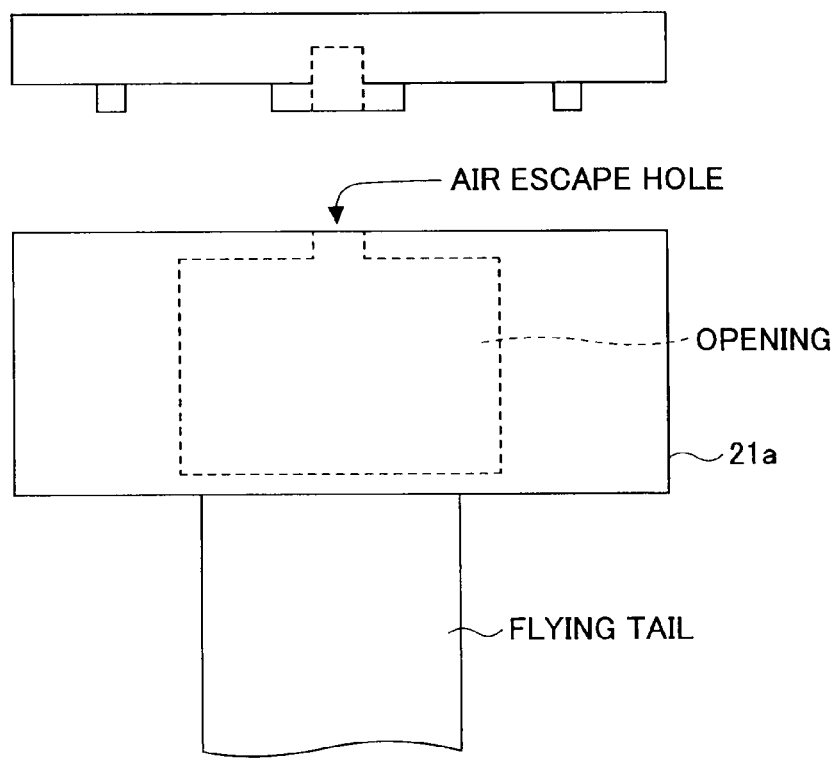
FIG. 18B shows an example of a manufacturing method of the rigid layer shown in FIG. 17.

FIGS. 18A and 18B show an example of a manufacturing method of the printed wiring board shown in FIG. 17. FIG. 18A shows a state at a time of shipping from a manufacturer. FIG. 18B shows a state at a time of using by a user.

Further, in a case where a plurality of layers of the rigid layer 21a are formed to laminate a plurality of pre-pregs, the opening is formed in at least one of the pre-pregs before laminating the pre-pregs.

Furthermore, the example shown in FIG. 18A shows when the opening is formed in the prepreg, an opening may be extended to a so-called sacrifice board, which is used as a guide for mounting parts in a solder bath. In this case, when the printed wiring board is manufactured, since the sacrifice board is integrated in the rigid layer of the later-to-be-manufactured printed wiring board, there is no risk that an etching liquid gets into an inside of the rigid layer 21a of the printed wiring board. When the parts of the printed wiring board are actually mounted and the sacrifice board is cut out, a portion of the opening is made to be exposed at an end of the rigid layer 21a of the printed wiring board (vide FIG. 18B). Accordingly, it is possible to secure an escape route of air when air inside the opening expands by an increased temperature of the printed wiring board.

Further, although there has been described about the case where the lens 22 is held by the lens holder 23 in the above embodiment, the present invention is not limited thereto. The signal processing circuit 24 may be configured by a plurality of chips.

Further, although there has been explained about a case where the signal processing circuit 24 is integrated into a single chip in the above embodiment, the present invention is not limited thereto. The signal processing circuit 24 may be configured by a plurality of chips.

Further, at least a part of the signal processing circuit 24 and the CMOS image sensor 26 may be integrated into a single chip in the above embodiment.

Further, although the sound synthesizer 61 and the alarm signal generator 62 are provided as a measure for notifying the alarm information in the above embodiment, it is possible to provide either one. Further, it is also possible to provide a warning lamp instead of either one of the sound synthesizer 61 and the alarm signal generator 62 or to provide the warning lamp in addition to the sound synthesizer 61 and the alarm signal generator 62.

Although there has been explained about the case where the image sensor module 20 is equipped in the vicinity of the car registration plate 1, the present invention is not limited thereto. The position of the image sensor module 20 may be changed depending on the size of the vehicle, the shape thereof, an object to be monitored, and/or an area to be monitored.

Further, although there has been explained about the case that the sensing device 10 include one image sensor module 20, the present invention is not limited thereto. The sensing device 10 may include a plurality of image sensor modules 20 depending on the size of the vehicle, the shape thereof, an object to be monitored, an area to be monitored, and the like.

Further, although there has been explained about the case where the travelling direction (forward) of the vehicle 1 is monitored by the sensing device 10, the backward and sides may also be monitored.

Further, it is possible to monitor at least two directions among the travelling direction (forward), the backward and sides.

Further, the image sensor module 20 can be used in a sensing device not in-vehicle. In this case, the main control device 40 outputs alarm information depending on purpose of sensing.

Furthermore, the image sensor module 20 can be used for other than a sensing device, for example a measurement apparatus.

The printed wiring board 21 in the above embodiment may be a printed wiring board having a sensor other than the image sensor. Any printed wiring board on which a package can be face-mounted by soldering may be used.

As described above, the printed wiring board according to the present invention is suitable for improving the reliability of a soldered joint of the package. The manufacturing method of the printed wiring board according to the present invention is suitable for manufacturing the printed wiring board having the improved reliability of soldered joint of the package. The sensor module according to the present invention is suitable for improvement of reliability. The sensing device according to the present invention is suitable for improvement of reliability.

Moreover, a sensing device may have the sensor module as described above and a display device for displaying information from the sensor module.

Moreover, the sensing device may have a memory for storing the information from the sensor module.

Moreover, the sensing device may be equipped in a vehicle, and may further include a monitoring control device for outputting alarm information when it is determined that there is a danger based on the information from the above sensor module.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that various changes, substitutions, and alterations could be made thereto without departing from the spirit and scope of the invention.

This patent application is based on Japanese Priority Patent Application No. 2008-260814 filed on Oct. 7, 2008, Japanese Priority Patent Application No. 2008-317853 filed on Dec. 15, 2008, and Japanese Unexamined Patent Application Publication No. 2004-335602, filed on May 2, 2003, the entire contents of which are hereby incorporated herein by reference.

What is claimed is:

1. A printed wiring board on which a package to be arranged, comprising:
   a first layer that is relatively rigid; and
   a second layer that is relatively flexible and on which the package is to be soldered,
   wherein an area other than a package arrangement area of the second layer is joined to the first layer by an adhesion layer, and wherein respective inner edge surfaces of the second layer, the adhesion layer, and a plurality of soldered portions between the second layer and the package, are aligned.

2. The printed wiring board according to claim 1, wherein the package has the plurality of soldered portions in the vicinity of an outer periphery of the package, and the package arrangement area is an area surrounded by the plurality of the soldered portions.

3. A sensor module comprising:

a sensor;

a package on which the sensor is disposed; and a printed wiring board on which the package is to be arranged, the printed wiring board including:

a first layer that is relatively rigid, and a second layer that is relatively flexible and on which the package is to be soldered, wherein an area other than an package arrangement area of the second layer is joined to the first layer by an adhesion layer, and wherein respective inner edge surfaces of the second layer, the adhesion layer, and a plurality of soldered portions between the second layer and the package, are aligned.

4. The sensor module according to claim 3, wherein the package is a package of a lead-less type.

5. The sensor module according to claim 3, wherein the package is a package of a ball grid array type.

6. The sensor module according to claim 3, wherein the sensor is an image sensor.

7. The sensor module according to claim 3, wherein the sensor is an image sensor with an integrated lens.

8. The sensor module according to claim 3, wherein the sensor is a CMOS image sensor.

9. The sensor module according to claim 3, wherein the sensor is a CCD image sensor.

10. The sensor module according to claim 3, further comprising:

a signal processing circuit for processing an output signal from the sensor, the signal processing circuit being arranged on the printed wiring board.

* * * * *